United States Patent [19]

Fenwick et al.

[11] Patent Number: 5,072,333
[45] Date of Patent: Dec. 10, 1991

[54] SWITCHING APPARATUS FOR HIGH FREQUENCY SIGNALS WITH PLURAL PARALLEL PRINTED CIRCUIT BOARDS INTERCONNECTED BY ALTERNATING INPUT AND ISOLATION LINES

[75] Inventors: Robert B. Fenwick, Los Altos; John W. McMains, Saratoga, both of Calif.

[73] Assignee: On Command Video Corporation, Santa Clara, Calif.

[21] Appl. No.: 538,551

[22] Filed: May 15, 1990

[51] Int. Cl.[5] .......................... H05K 1/14; H05K 9/00
[52] U.S. Cl. ................................... 361/413; 361/412; 361/424
[58] Field of Search ................. 307/113, 115; 361/396, 361/412, 413, 415, 393, 394, 395, 424

[56] References Cited

U.S. PATENT DOCUMENTS

| | | | |
|---|---|---|---|
| 2,907,924 | 10/1959 | Lutton | 361/393 X |
| 3,596,140 | 7/1971 | Walsh | 361/412 |
| 4,868,712 | 9/1989 | Woodman | 361/396 X |

FOREIGN PATENT DOCUMENTS 1150721 6/1963 Fed. Rep. of Germany ...... 361/412

OTHER PUBLICATIONS

Application Note AN86-1 by Gareth Powell, "The DG536 Wide Band Multiplexer Suits a Wide Variety of Applications", (Jul. 1986).

Primary Examiner—Leo P. Picard
Assistant Examiner—Michael W. Phillips
Attorney, Agent, or Firm—Flehr, Hohbach, Test, Albritton & Herbert

[57] ABSTRACT

An apparatus is provided for providing a plurality of high frequency input signals to each of a plurality of respective integrated circuit devices and for receiving at least one respective high frequency output signal from each respective device, the apparatus comprising: a plurality of respective substantially planar mounting platforms on which the respective devices are respectively mounted, wherein respective mounting platforms are aligned substantially parallel to each other; a plurality of respective input lines for conducting the respective input signals, each respective input line extending in a direction substantially perpendicular to the respective planes of the respective mounting platforms, and each respective input line being electrically coupled to respective mounting platforms that mount respective devices that are to receive respective input signals conducted by each respective input line; and a plurality of respective isolation lines for electrically isolating adjacent input lines from each other, each respective isolation line extending in a direction substantially perpendicular to the respective planes of the respective mounting platforms, such that adjacent input lines have at least one respective isolation line interposed therebetween.

20 Claims, 12 Drawing Sheets

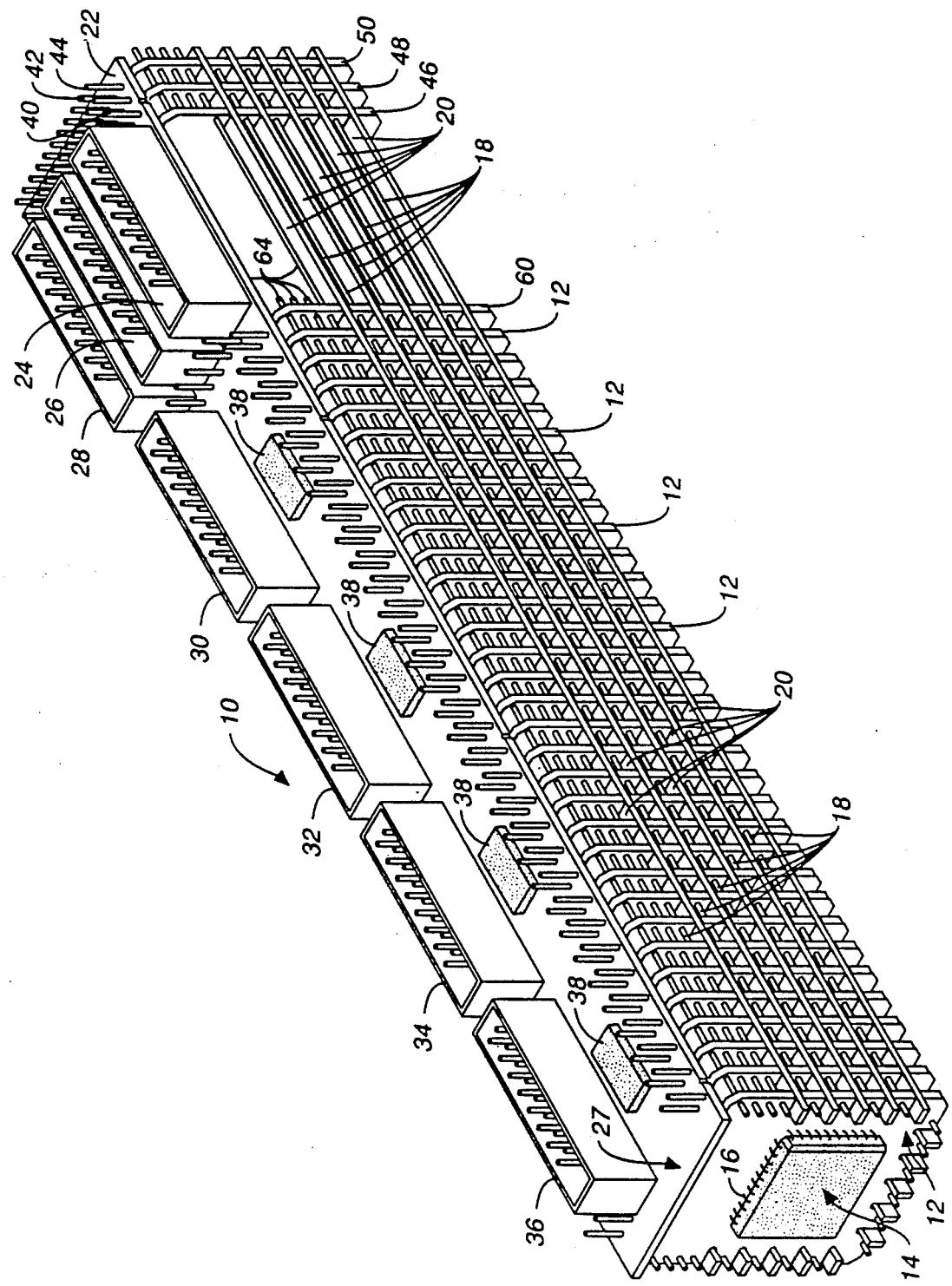
FIG._1

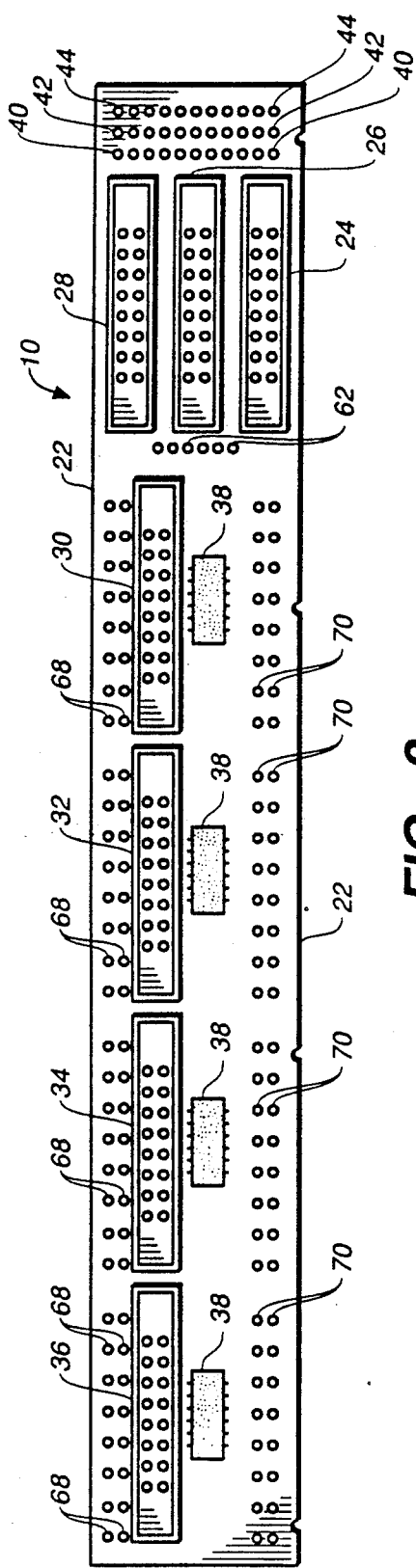
FIG._2
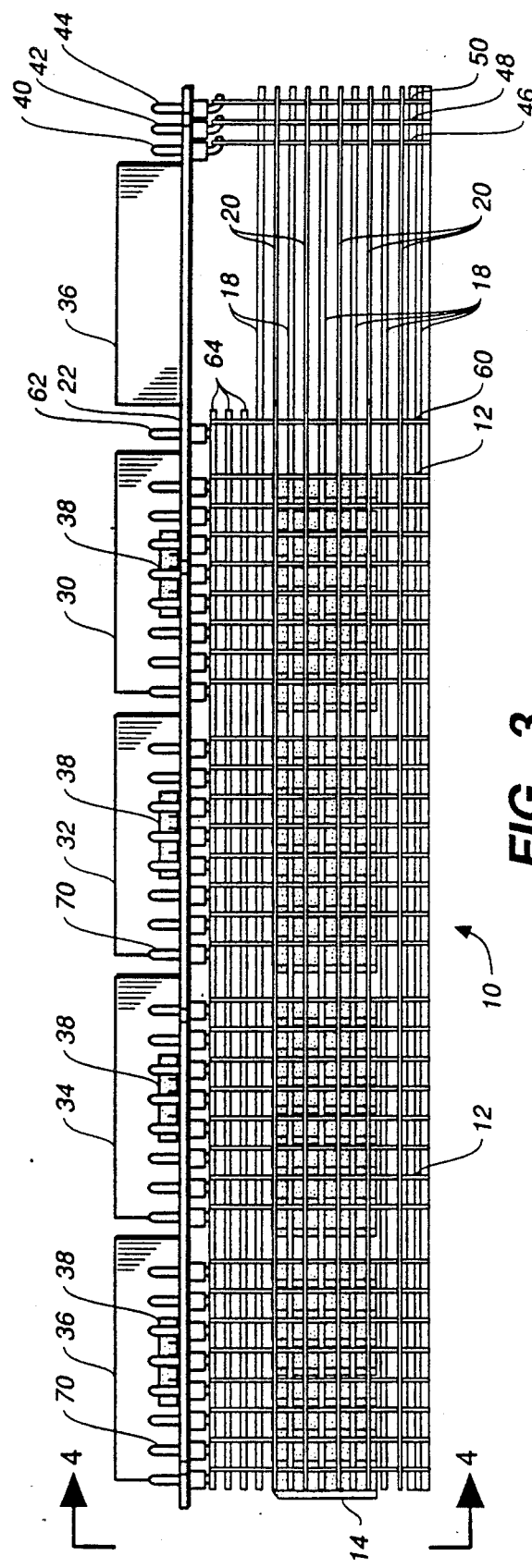
FIG._3

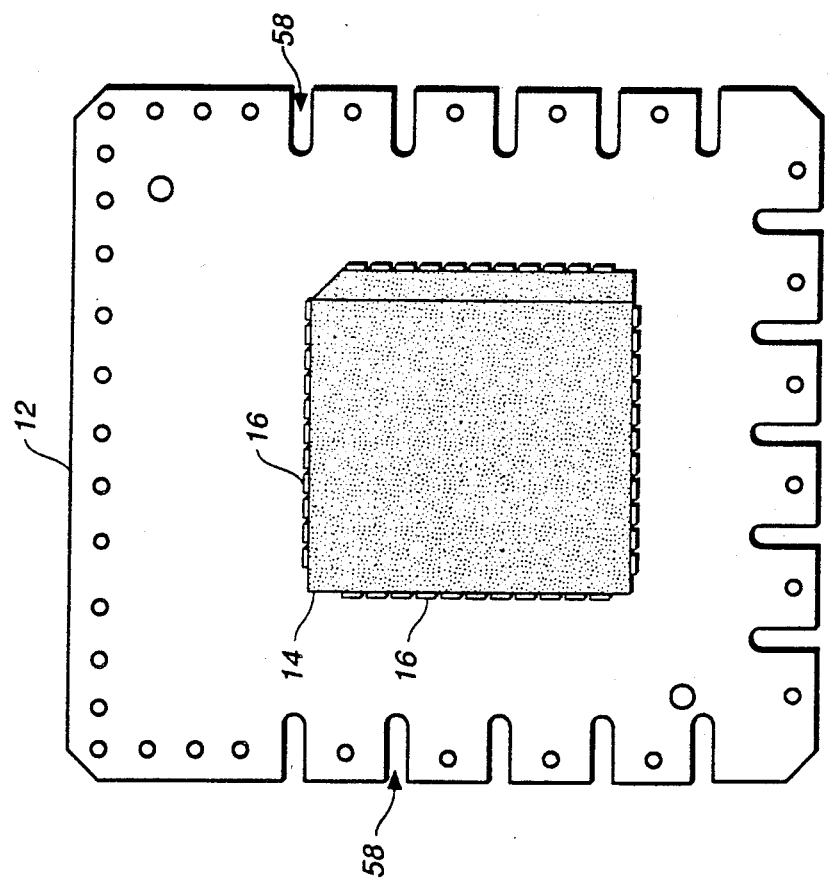
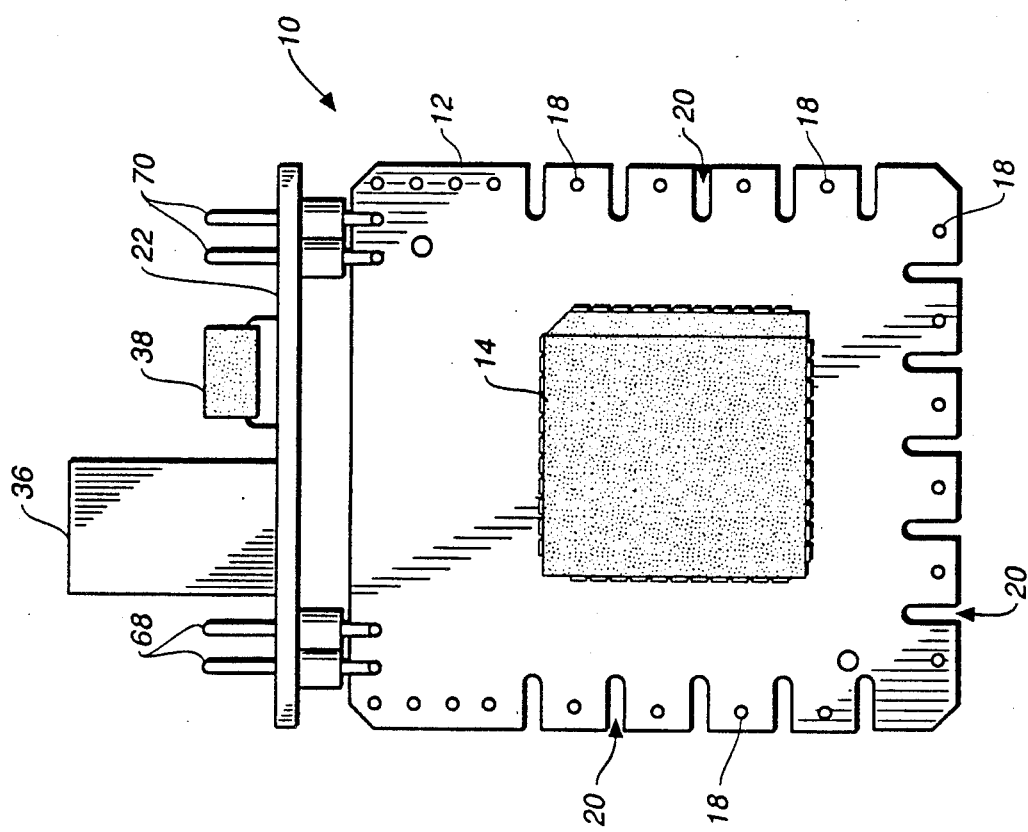

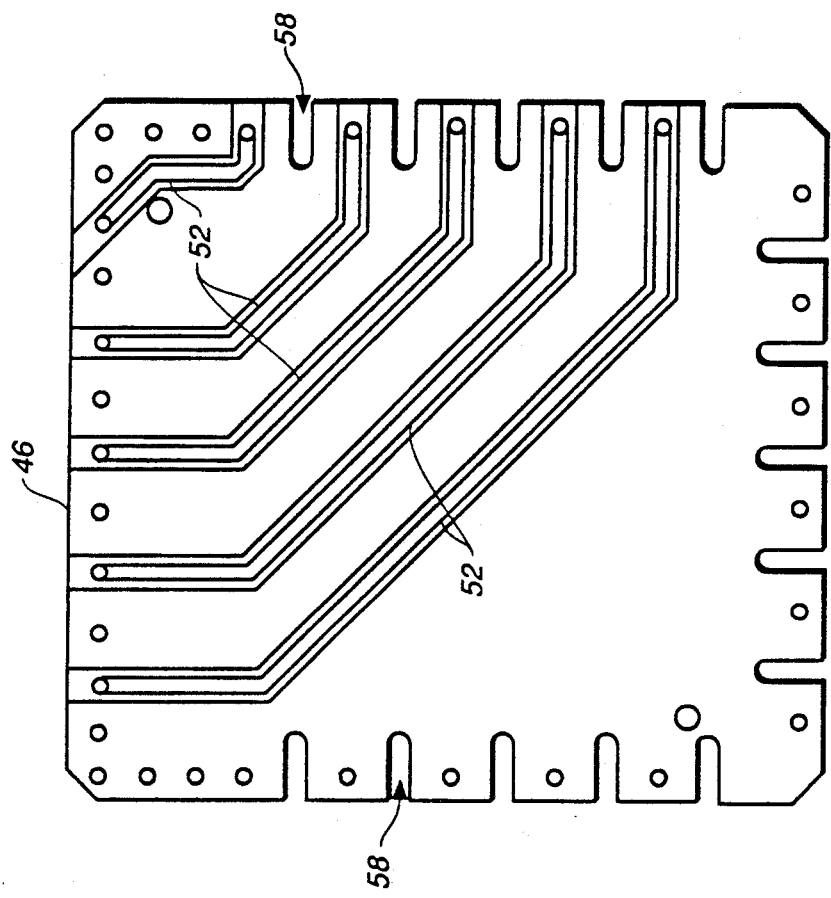
FIG._5B
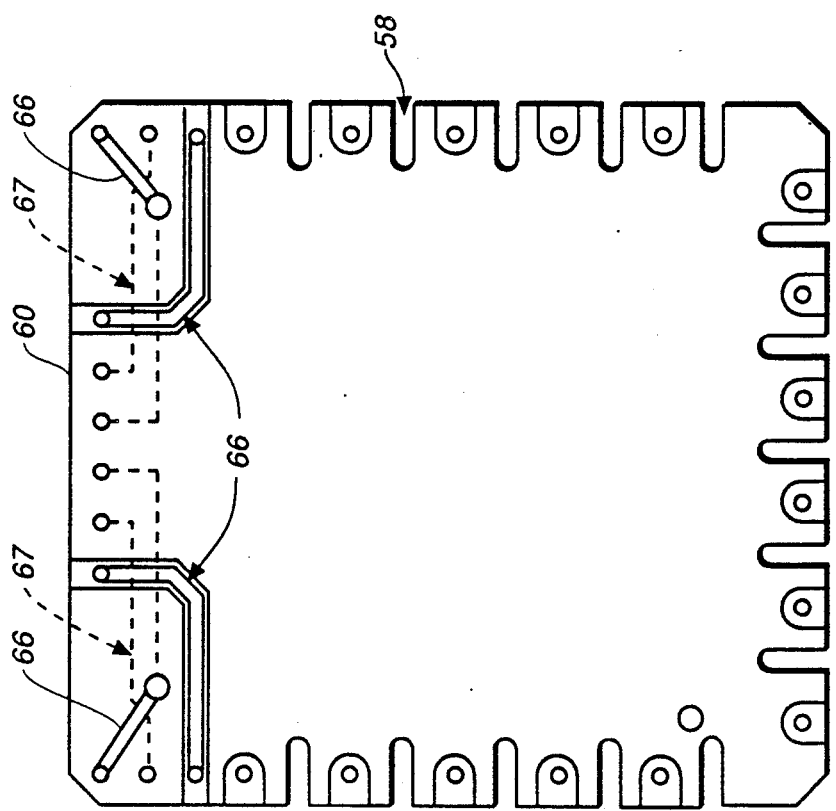
FIG._5A

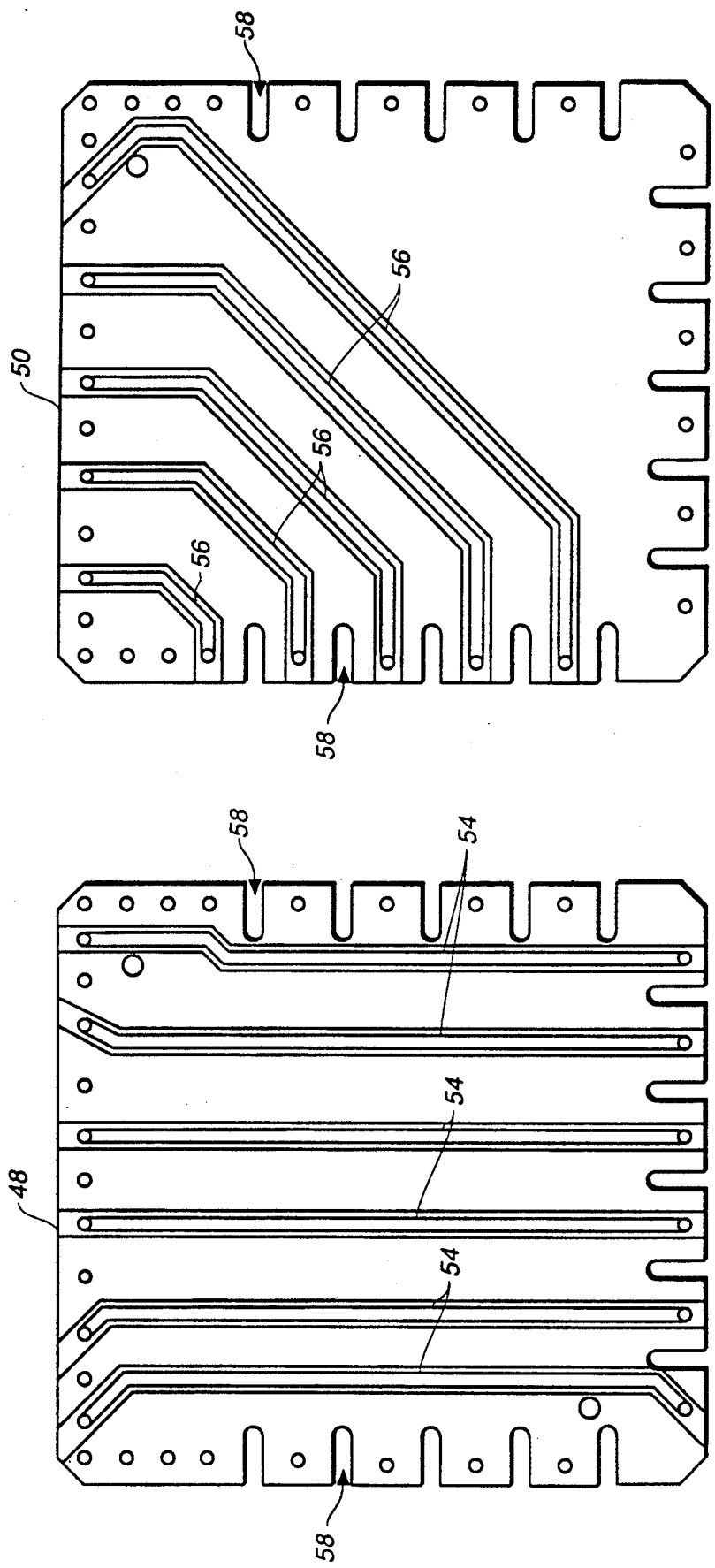

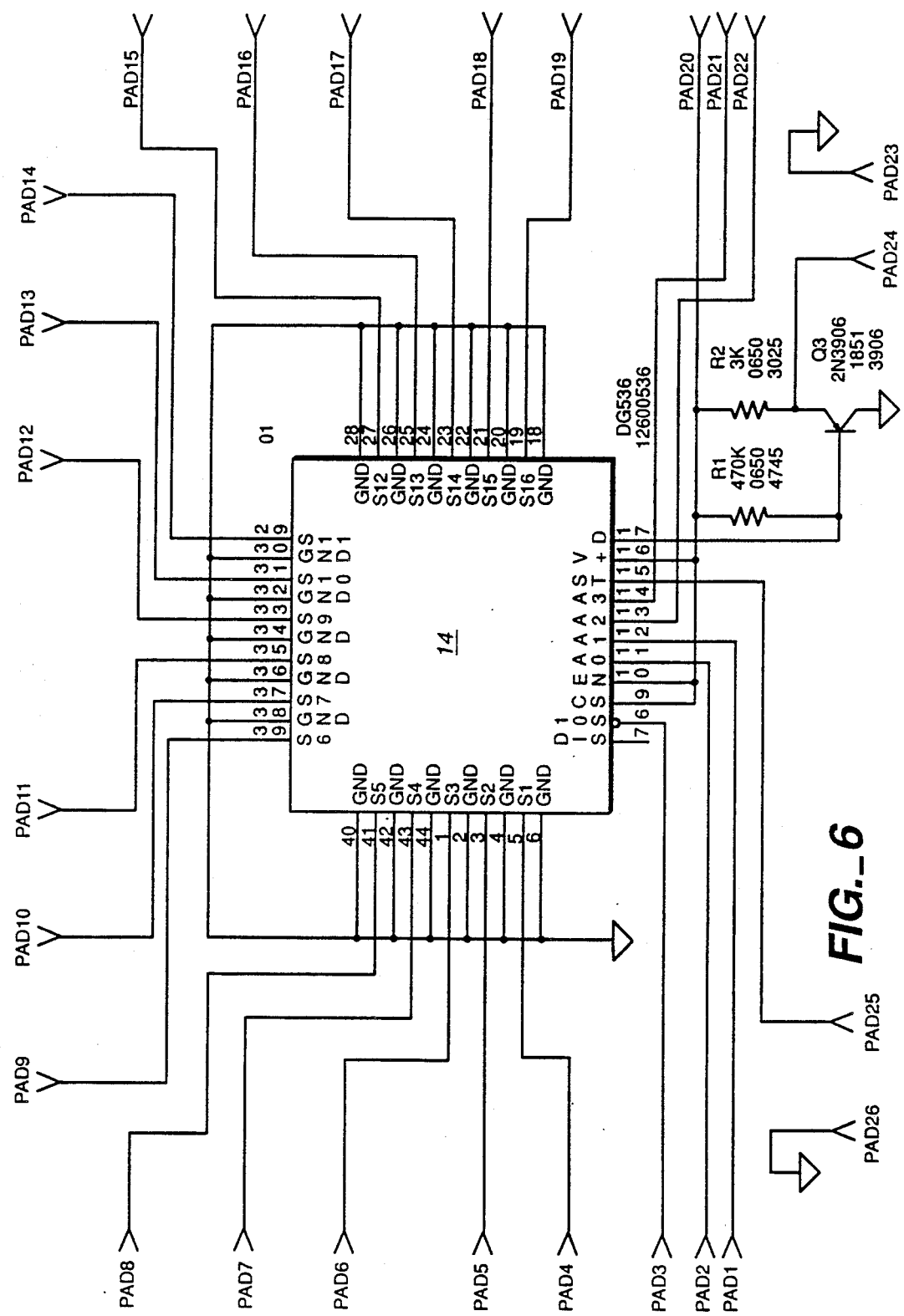
FIG._6

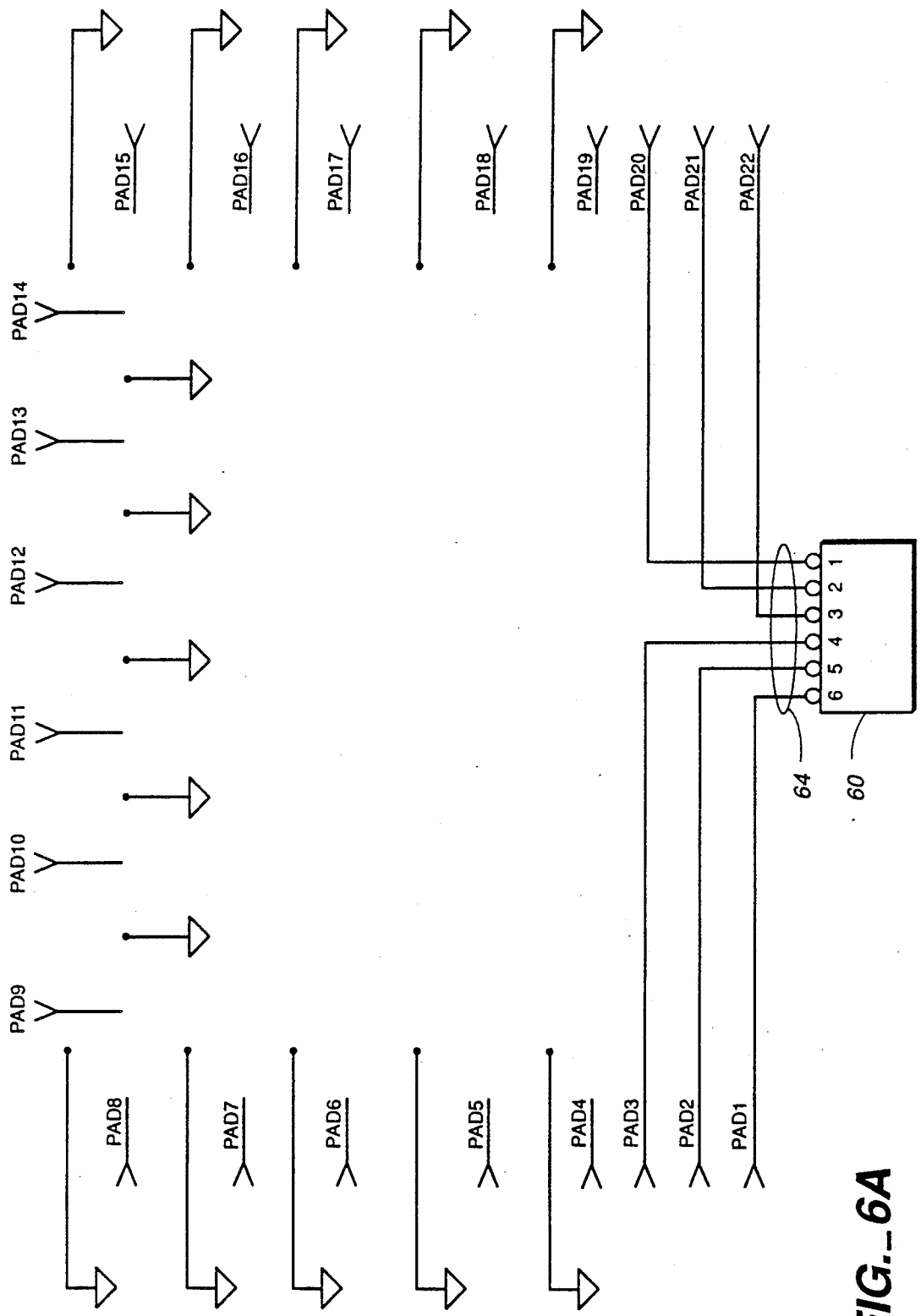
FIG._6A

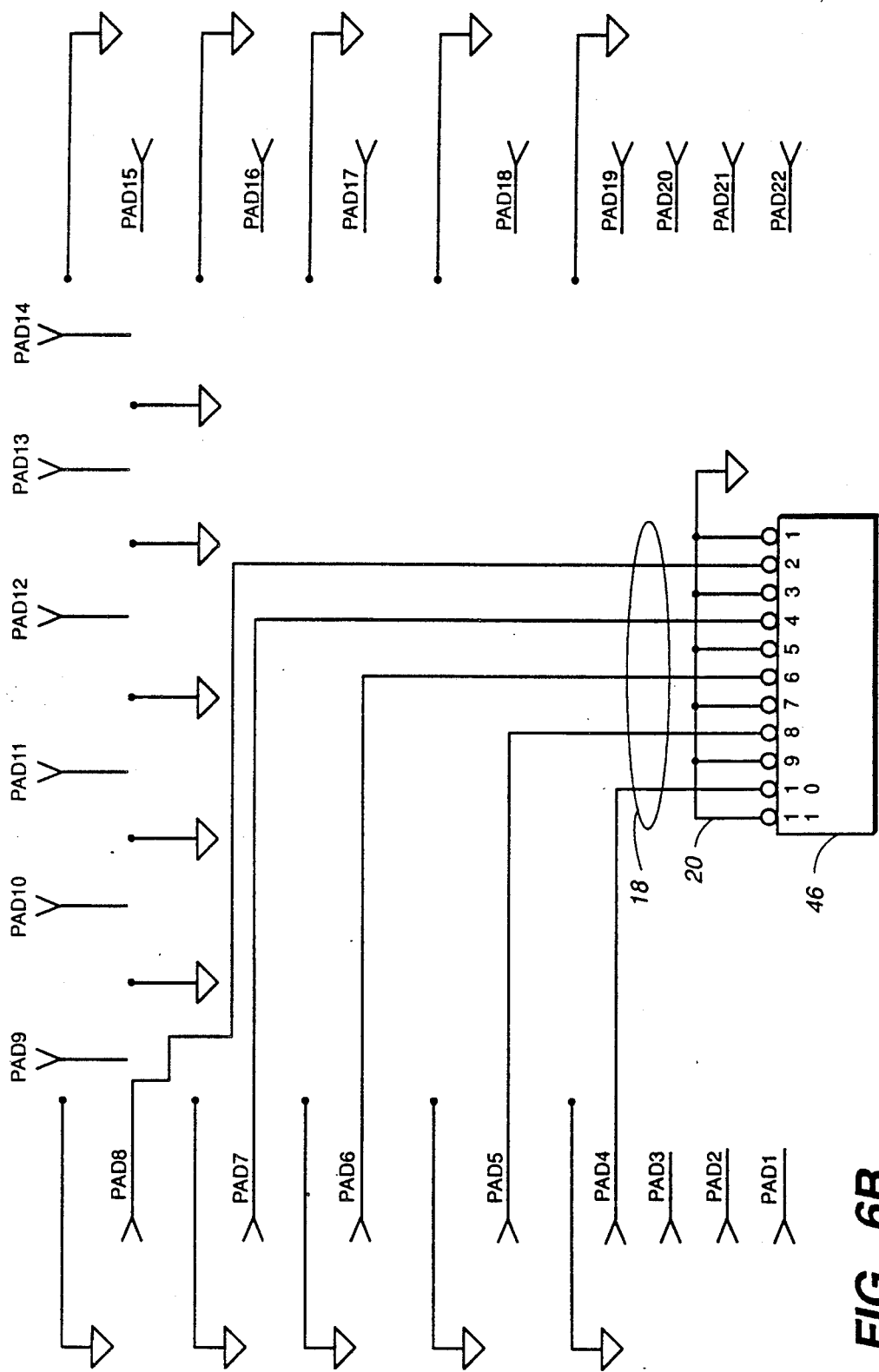
FIG._6B

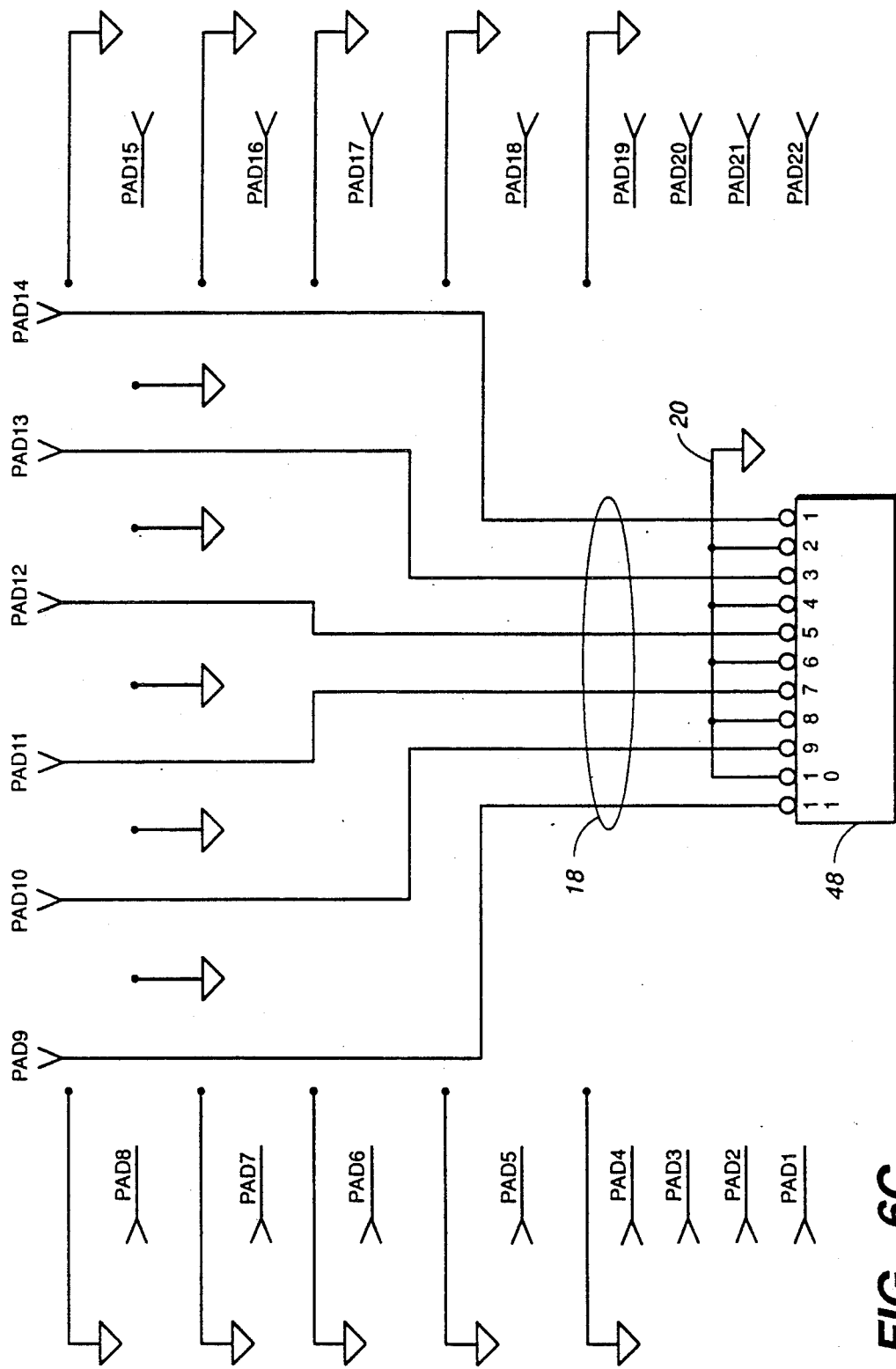
FIG._6C

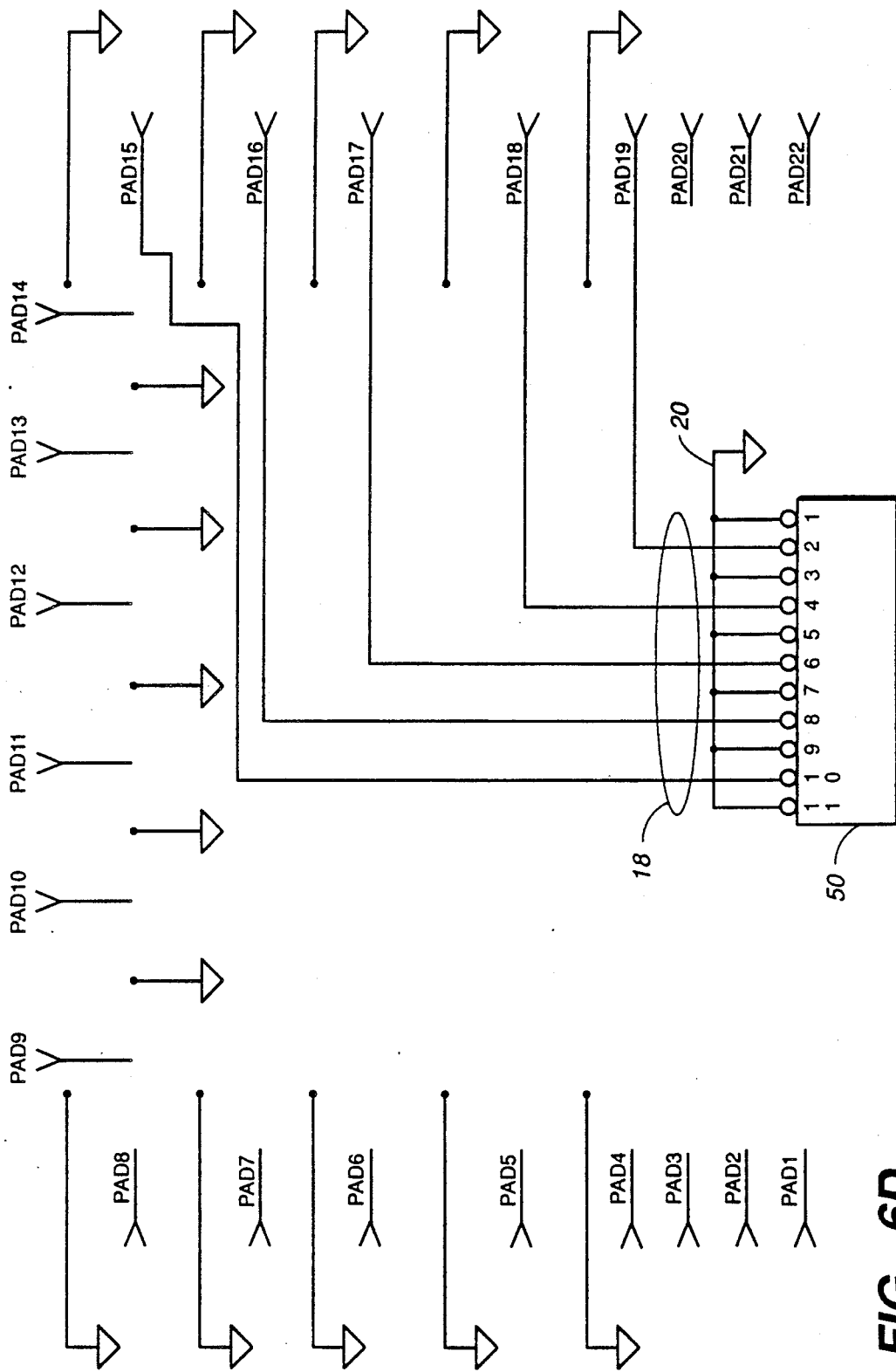
FIG._6D

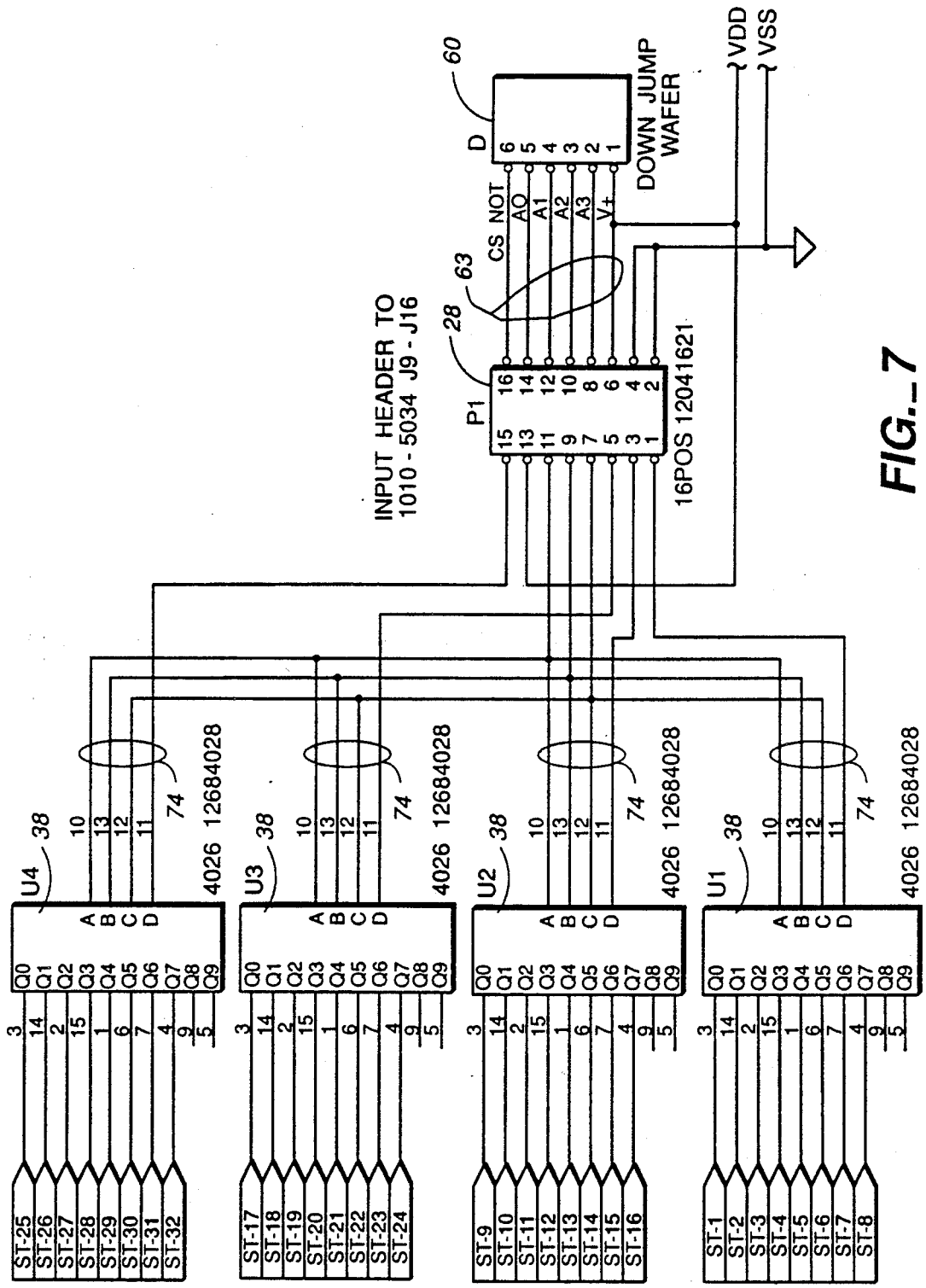
FIG._7

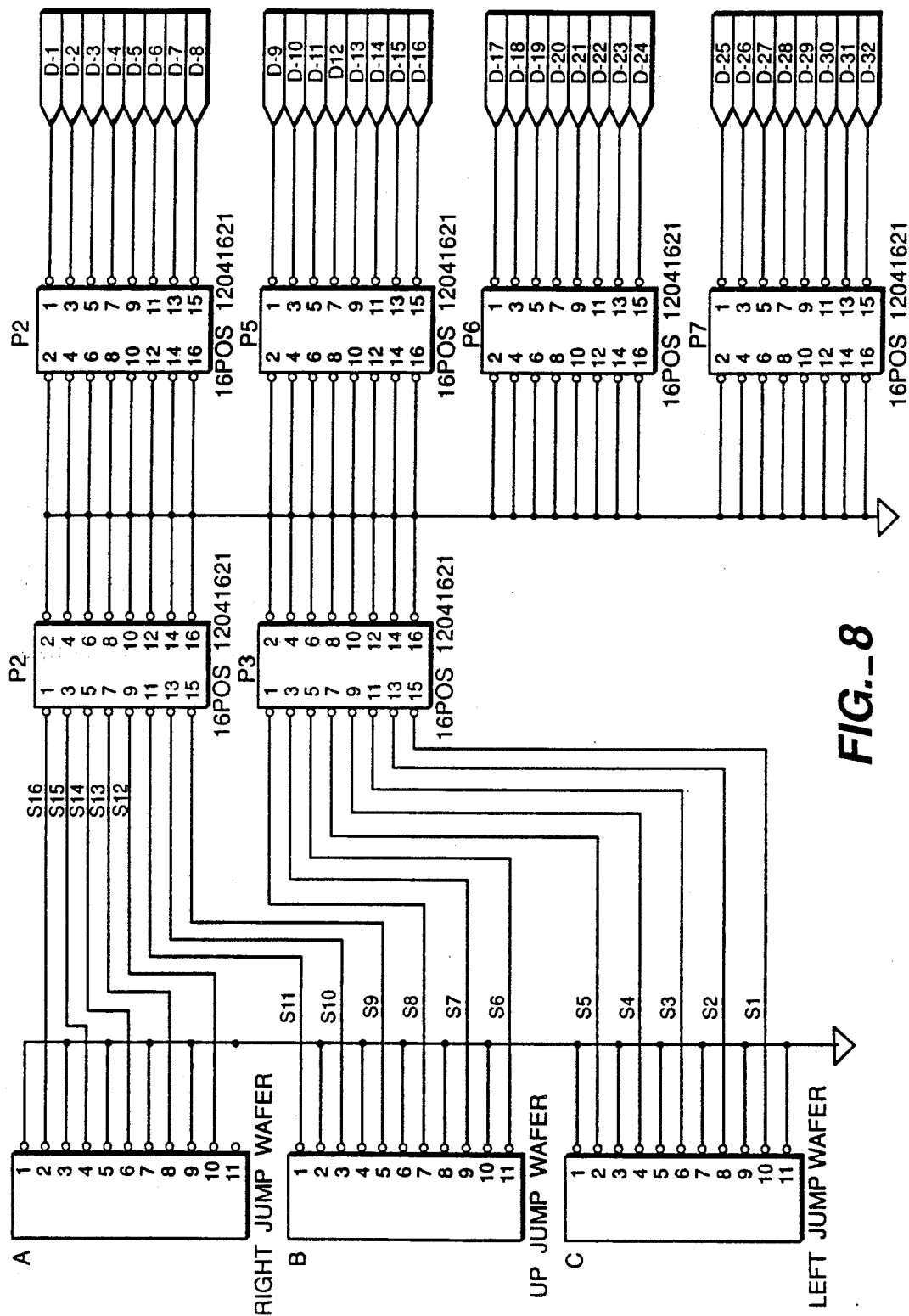
FIG._8

SWITCHING APPARATUS FOR HIGH FREQUENCY SIGNALS WITH PLURAL PARALLEL PRINTED CIRCUIT BOARDS INTERCONNECTED BY ALTERNATING INPUT AND ISOLATION LINES

BACKGROUND OF THE INVENTION

1. Field of the Invention

The invention relates generally to the switching of high frequency signals and more particularly to the switching of a plurality of high frequency signals among a plurality of terminals.

2. Description of the Related Art

Switches used to switch a plurality of high frequency signals among a plurality of terminals are well known. One problem associated with the switching of a plurality of high frequency signals is the maintenance of electrical isolation between the signals so as to avoid unwanted inter-

SUMMARY OF THE INVENTION

The invention provides a switching apparatus for switching high frequency input signals among a plurality of terminals. In particular, the switching apparatus is for use with integrated circuit devices which can receive a plurality of high frequency input signals and which can select from among those received input signals so as to provide a high frequency output signal. The switching apparatus includes a plurality of respective substantially planar mounting platforms on which respective devices are mounted. The mounting platforms are stacked substantially parallel to each other. A plurality of respective input signal lines extend in a direction substantially perpendicular to the respective planes of the mounting platforms. Each respective input line is electrically coupled to at least one mounting platform on which a device is mounted. A plurality of respective electrically grounded isolation lines extend in a direction substantially perpendicular to the planes of the mounting platforms. Adjacent input signal lines have at least one isolation line interposed between them. Thus, a compact switching apparatus is provided which can switch a plurality of high frequency input signals among a plurality of output terminals while maintaining substantial electrical isolation of the input signals from each other. These and other features and advantages of the present invention will become apparent from the following description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which:

FIG. 1 is a perspective view of a switching apparatus in accordance with the invention;

FIG. 2 top elevation view of the switching apparatus of FIG. 1;

FIG. 3 elevation view of the switching apparatus of FIG. 1;

FIG. 4 is an end elevation view of the switching apparatus a lines 4—4 in FIG. 3;

FIG. 5 is a top elevation view of a representative mounting platform and integrated circuit device of the switching apparatus of FIG. 1;

FIGS. 5A-5D are top elevation views of a respective output selection platform and respective first, second and signal platforms;

FIG. 6 is a schematic diagram showing the electrical of a representative integrated circuit of the switching apparatus of FIG. 1;

FIGS. 6A-6D schematic diagrams showing the electrical connections of the respective output selection signal platform and the respective first, second and third input signal platforms;

FIG. 7 is a schematic diagram showing electrical connections among the control signal connector, the output platform and the decoders of the apparatus of FIG. 1; and FIG. 8 is a schematic diagram showing electrical the input signal connectors and the first, second and third input signal platforms and showing the electrical connections between the respective output signal connectors and respective output signals provided by the thirty-two integrated circuit devices of the switching apparatus of FIG. 1.

DETAILED DESCRIPTION OF THE PREFERRED EMBODIMENT

The present invention comprises a novel switching apparatus for providing a plurality of high frequency input signals to each of a plurality of respective integrated circuit devices and for receiving at least one high frequency output signal from each of the respective devices. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Referring to the illustrative drawings of FIG. 1, there is shown a perspective view of a switching apparatus 10 in accordance with a presently preferred embodiment of the invention. The switching apparatus includes a plurality of substantially planar mounting platforms 12 which are stacked parallel to each other. Each mounting platform 12 is a printed circuit board (PCB) having a respective integrated circuit device 14 mounted thereon. Each respective integrated circuit device 14 has a plurality of pin terminals 16 electrically coupled to conductive paths (not shown) formed in the PCB mounting platform 12. A plurality of respective input lines 18 extend in a direction substantially perpendicular to the planes of the mounting platforms 12. Each respective input line is electrically coupled to each of the PCB mounting platforms 12. The input lines 18 are suited to conduct high frequency input signals along the length of the apparatus 10 and to provide those input signals to conductive paths on each and every one of the mounting platforms 12. In the presently preferred embodiment, the high frequency signals are video signals in the range 0 Hz to 5M Hz.

A plurality of respective metal isolation lines 20 also extend along the length of the switching apparatus 10 in a direction substantially perpendicular to the planes of the respective PCB mounting platforms 12. Each respective isolation line 20 constitutes a thin elongated bar having wide flat surface. Each isolation line 20 is interposed between adjacent input lines 18 so as to electrically isolate the input lines 18 from each other in order to avoid unwanted interference or cross-talk between the input signals conducted by the input lines 18. The wider surfaces of the isolation lines 20 are aligned such that they face each other with input lines 18 interposed in between them. In this configuration, the isolation lines 20 provide maximum isolation of adjacent input lines 18. Each of the isolation lines 20 is electrically coupled to conductive paths (not shown) on each of the PCB mounting platforms 12, and in operation, the isolation lines 20 are coupled to ground potential and to a conductive layer completely covering the back side of the mounting platform 12 which is electrically coupled to ground potential. This conductive layer isolates each integrated circuit device 14 from its neighbors to avoid interference or cross-talk between signals selected by the device 14 or present on input lines 18.

The switching apparatus 10 of the present invention will be better understood after a brief explanation of the operation of the respective integrated circuit 15 devices 14 mounted thereon. In the presently preferred embodiment, the devices 14 comprise DG536 16-channel wideband/video multiplexers produced by Siliconix, Inc. having a place of business in Santa Clara, California. Referring to FIG. 6, there is shown a schematic diagram of a representative 16-channel wideband/video multiplexer device 14 electrically coupled for use in conjunction with the switching apparatus 10 of the present invention. In brief, the device 14 receives sixteen high frequency input signals on terminals labeled S1 through S16. The device selects one of the input signals provided on terminals S1 through S16 and provides the selected input signal as an output signal on the terminal labeled D. The selection of the output signal is accomplished by providing output selection signals A0 through A3 in conjunction with appropriate control enable signal CS. CS and EN are tied to a 5 volt power supply and are not used for control in the preferred embodiment. In particular, output selection signals A0 through A3 indicate which of the input signals S1 through S16 is to be selected as an output signal to be provided on terminal D. Then, upon the provision of a strobe signal (ST), in conjunction with the appropriate control enable signals and the address signals, the selection is made. Thereafter, the selected input signal is provided as the output signal until a subsequent strobe signal (ST) is provided to the device 14. One skilled in the art will appreciate the details of the operation of the device 14.

It will be appreciated that, internal to each device 14, the high frequency signals S1 through S16 are maintained in electrical isolation from each other. Moreover, external to the device 14 the high frequency signals S1 through S16 also are maintained in electrical isolation to each other by interposing conductive terminals held at electrical ground potential (GND) between adjacent input signal terminals. As explained more fully below, each of terminals S1 through S16 is electrically coupled to one of the input lines 18. Moreover, each respective isolation line 20 is electrically coupled to a respective GND terminal of the device 14 so as to maintain external isolation of input signals S1-S16.

In the presently preferred embodiment of the switching apparatus 10, there are thirty-two devices coupled like that in FIG. 6. The switching apparatus 10 controls which input signals S1 through S16 are to be provided as output signals on respective D terminals (D1-D32) of each of the thirty-two devices 14.

Referring now to FIGS. 1-4, the switching apparatus 10 includes a substantially planar main PCB platform 22 disposed adjacent to the stack of PCB mounting platforms 12 and having its main planar surface extending in a direction substantially perpendicular to the respective planar mounting platforms 12. Three ribbon cable connectors 24, 26 and 28 are mounted on top of one end of the main platform 22. Four more ribbon cable connectors 30, 32, 34 and 36 are mounted end-to-end along the length of one side of the main platform 22. First input signal connectors 24, 26 can be coupled to a ribbon cable (not shown), which forms no part of the present invention, which provide the high frequency input signals (S1-S16). Second output signal connectors 30, 32, 34 and 36 can be connected to ribbon cables (not shown) which can receive the respective high frequency output signals (D1-D32) provided by the respective devices 14 mounted on the plurality of mounting platforms 12. A third control signal connector 28 can be connected to another ribbon cable (not shown) which can provide digital logic level control signals such as device selection signals, which are used to generate the strobe (ST1-ST32) signals, for selecting among the plurality of devices 14 and output selection signals (A0-A3 and $\overline{CS}$), which for a selected device 14, determine which input signal (S1-S16) is to be provided as an output signal.

Four decoders 38 also are mounted on top of the main board 22. Each respective decoder 38 is associated with a corresponding one of the second output signal connectors. The four decoders 38 are distributed along the length of the main platform 22 such that each second output signal connector is paired with a corresponding decoder 38. In the presently preferred embodiment, each decoder is a CD4028B produced by RCA Corporation having a place of business at Summerville, N.J., for example.

Input signals provided to the first input signal connectors 24, 26 are conducted via conductive paths in the main PCB platform 22 to jump conductors 40, 42, 44 which couple the signals to conductive paths on first, second and third input boards 46, 48, 50. The input boards 46, 48, 50 are electrically coupled to the input lines 18 which carry the input signals to each of the mounting platforms 12.

More particularly, referring to the illustrative drawings of FIGS. 2 and 3, the main PCB platform 22 provides conductive paths (not shown) between the two first input connectors and jump conductors 40, 42 and 44 disposed near the end of the main platform 22. A first row of jump conductors 40 is electrically coupled to the first PCB input platform 46. A second row of jump conductors 42 is electrically coupled to the second PCB input platform 48. A third row of jump conductors 44 is electrically coupled to the third PCB input platform 50. The respective first, second and third input platforms are aligned substantially parallel to the plurality of mounting platforms 12.

The illustrative drawings of FIG. 5B show details of the first PCB input platform 46 on which five conductive paths 52 electrically couple five jump conductors 40 to five of the plurality of input lines 18. Referring to the illustrative drawings of FIG. 5C, there are shown details of the second PCB input platform 48 on which six conductive paths 54 electrically couple six jump conductors 42 to six of the input lines 18. Referring to the illustrative drawings of FIG. 5D, there are shown details of the third input platform 50 on which five conductive paths 56 electrically couple five jump conductors 44 to the remaining five input lines 18.

The grooves 58 formed along the perimeters of each of the first, second and third input platforms are used to receive the isolation lines 20. Moreover, referring to the illustrative drawing of FIG. 5, there is shown a representative PCB mounting platform 12 with a device 14 mounted thereon. The grooves 58 formed in that mounting platform 12 also are used to receive respective isolation lines 20. It will be appreciated that the input lines 18 and the isolation lines 20, in addition to performing electrical functions, also provide structural support to the switching apparatus 10.

As mentioned above, the digital logic level control signals provided to the third control signal connector 28 include encoded digital logic level device selection signals used to generate strobe signals (ST1–ST32) and output selection signals (A0–A3) and $\overline{CS}$) used to select from among the various input signals (S1–S16) for a selected device 14. Encoded device selection signals are conducted via conductive paths (not shown) in the main platform 22 to each of the decoders 38. The decoders 38 decode the device selection signals and produce the strobe signals. The decoders 38 are coupled to individual mounting PCB platforms 12 by jump conductor pairs 70 on which digital logic level strobe signals (ST) are provided to respective mounting PCB platforms 12 for provision to individual devices 14.

The digital logic level output selection signals are provided to jump conductors 62 via conductive paths (not shown) in the main platform 22. Thereafter, they are conducted from output selection signal PCB platform 60 to lines 64 which conduct them to each and every one of the mounting platforms 12.

As shown on FIGS. 1 and 3 the output selection signal PCB platform 60 is aligned substantially parallel to the PCB mounting platforms 12. The output selection signal lines 64 extend perpendicular to the planes of the PCB mounting platforms 12 and make electrical contact with each of the mounting platforms 12. Referring to the illustrative drawings of FIG. 5A, there are shown details of the output selection signal platform 60 and two conductive paths 66 thereon. With regard to FIG. 5A, the conductive paths 67 shown with dashed lines are disposed on the platform 60 opposite from path 66.

Referring to FIGS. 2 and 3, individual output signals (D1–D32) are provided via pairs of jump conductors 68 to adjacent second output signal connectors 30, 32, 34, 36. One of the two jump conductors 68 of each pair is coupled to ground potential and the other is coupled to the D terminal of a respective device 14. Each pair of jump conductors 68, in turn, is electrically coupled to a corresponding pair of terminals of a respective second output signal connector by conductive lines (not shown) formed in the main PCB platform 22. It will be appreciated that the selected output signals provided at the D terminals of the devices 14 are high frequency signals, and that by pairing a high frequency output signal (D) with ground potential for each pair of jump conductors 68, electrical isolation of the high frequency output signals (D) is maintained.

The operation of the switching apparatus 10 now will be described in more detail. Referring to the schematic diagram of FIG. 8, there are shown the connections between the first input signal connectors 24, 26 and the respective first, second, and third input PCB platforms 46, 48 and 50. It can be seen that high frequency signals S1 through S16 are provided to the first input connectors 24, 26 and in turn, are provided to the first, second and third input PCB platforms 46, 48 and 50. Moreover, interleaved between each high frequency input signal is an isolation line 20-1 which is maintained at ground potential.

The illustrative schematic drawings of FIGS. 6 and 6B, show the correspondence between the high frequency input signals provided to the first input PCB platform 46 and the input signals provided to a representative device 14 via input lines 18 corresponding to lines labeled as PAD4 through PAD8. Referring to the illustrative drawings of FIG. 6 and 6C, show the correspondence between the high frequency input signals provided to the second input PCB platform 48 and the high frequency input signals provided to a representative device 14 via input lines 18 corresponding to the lines labeled PAD9 through PAD 14 in FIG. 6C. The illustrative schematic drawings in FIGS. 6 and 6D, show the correspondence between the high frequency input signals provided to the third input PCB platform 50 and the input signals provided to a representative device 14 by input lines 18 corresponding to the lines labeled PAD15 through PAD19 in FIG. 6D. It will be noted that between each high frequency line in FIGS. 6B, 6C and 6D, there are interposed isolation lines 20 maintained at ground potential. Moreover, in the presently preferred embodiment of the switching apparatus 10, each of the plurality of devices 14 is coupled in a manner identical to the representative device of FIG. 6.

The schematic drawings of FIG. 8, also show the connection of the output connectors 30, 32, 34 and 36 so as to receive high frequency output signals D-1 through D-32. It will be appreciated that each output signal (D1–D32) always corresponds to a selected one of the high frequency input signals (S1–S16) provided to the devices 14.

The illustrative schematic drawings of FIGS. 6, 6A and 7, show the connections between the control connector 28 and the decoders 38 and the output selection signal PCB platform 60. In operation, the third control signal connector 28 receives control signals. Output selection control signals are provided via lines 63 to the output selection signal PCB platform 60. Referring to FIG. 6A, the platform 60 provides the output selection signals on lines 64 which correspond to lines labeled PAD1-3 and PAD20-21. It will be appreciated that the output selection signals are provided to each of the plurality of devices 14 as indicated in the drawing of the representative the device of FIG. 6.

Referring once again to FIG. 7, the encoded device selection control signals are provided on lines 74 to the decoders 38. One skilled in the art will appreciate that the decoders 38 provide one of thirty-two different strobes on strobe lines ST1 through ST32 in response to each different combination of encoded device selection signals. In operation, a respective device 14 that receives a strobe signal (ST) responds to the output selection signals provided on lines 64 by selecting the respective input signal S1-S16 identified by the output selection signals A0-A3 on lines 64. Nonstrobed devices simply do not respond to the output selection signals on lines 16. Thus, for example, when the seventeenth device 14 which is coupled to receive a strobe on a line labeled in FIG. 7 as ST17 receives a strobe, then that particular device selects its output signal (D17) based upon the value of the output selection signals A0-A3 contemporaneously provided on lines 64. It will be appreciated that each and every device 14 has its selection of output signal controlled in this manner.

Thus, the present invention advantageously provides a switching apparatus 10 which is relatively compact, and yet can switch a plurality of signals among a plurality of high frequency output terminals. While one embodiment of the invention has been described in detail, it will be appreciated that various alternative embodiments can be produced without departing from the invention. Thus, the foregoing description is not intended to limit the invention which is described in the appended claims in which:

What is claimed is:

1. A switching apparatus for use with a plurality of respective integrated circuit devices, each device including a plurality of respective pin terminals, wherein each of said respective devices can receive a plurality of high frequency input signals and can select from among the received input signals to provide at least one high frequency output signal, said switching apparatus comprising:
   a plurality of respective substantially planar mounting platforms on which said respective devices are to be respectively mounted, wherein said respective mounting platforms are aligned substantially parallel to each other;
   a plurality of respective input lines for conducting the respective input signals, each of said respective input lines extending in a direction substantially perpendicular to the respective planes of said respective mounting platforms, and each of said respective input liens being electrically coupled to said respective mounting platforms that are to mount said respective devices that are to receive respective input signals conducted by each of said respective input lines; and
   a plurality of respective isolation lines for electrically isolating adjacent ones of said input lines from each other, each of said respective isolation lines extending in a direction substantially perpendicular to the respective planes of said respective mounting platforms, such that adjacent ones of said input lines have at least one of said isolation lines interposed therebetween.

2. The apparatus of claim 1 wherein each respective input line is electrically coupled to all of the respective mounting platforms.

3. The apparatus of claim 1 wherein each respective isolation line is electrically coupled to all of the respective mounting platforms.

4. The apparatus of claim 1 wherein each respective isolation line comprises a respective elongated flat strip.

5. The apparatus of claim 1 wherein each respective mounting platform includes a respective printed circuit board on which there are a plurality of respective conductive paths between respective pin terminals of a respective device to be mounted thereon and a respective perimeter of said respective mounting platform.

6. The apparatus of claim 1 wherein:
   each respective mounting platform includes a respective printed circuit board on which there are a plurality of respective input conductive paths between respective pin terminals of a respective device to be mounted thereon and a respective perimeter of said respective mounting platform;
   each respective printed circuit board includes a plurality of respective isolation paths between respective ground terminals of a respective device to be mounted thereon and the respective perimeter of said respective mounting platform;
   for each respective printed circuit board, each input conductive path thereon is straddled by respective isolation paths thereon;
   at least one of said respective input liens is electrically coupled to at least one respective input conductive path of at least one respective mounting platform; and
   each of the respective isolation paths of at least one respective mounting platform is electrically coupled to at least one isolation line.

7. The apparatus of claim 1 and further comprising:
   input signal coupling means for respectively providing respective input signals to the plurality of respective input lines.

8. The apparatus of claim 7 wherein said input signal coupling means also is for respectively coupling each of the plurality of respective isolation lines to ground potential.

9. The apparatus of claim 1 and further comprising:
   input signal coupling means for respectively providing respective input signals to the plurality of respective input lines and for respectively coupling each of the plurality of respective isolation lines to ground potential;
   wherein said input signal coupling means includes at least one first cable connector means for making electrical contact with at least one first external cable providing multiple input signals and includes at least one planar input platform, aligned substantially parallel to said plurality of mounting platforms; and
   wherein the at least one planar input platform provides multiple conductive paths between said at least one cable connector means and multiple of said plurality of respective input lines.

10. The apparatus of claim 9 wherein said at least one input platform provides multiple ground potential conductive paths between said at least one cable connector means and multiple of said plurality of respective isolation lines.

11. The apparatus of claim 9 and further including:
   a main planar platform aligned substantially perpendicular to the respective planes of the plurality of respective mounting platforms and the at least one input platform;
   wherein said at least one first cable connector means is mounted on said main planar platform.

12. The apparatus of claim 1 and further including:
   output signal coupling means for respectively receiving respective output signals respectively provided by the respective devices mounted on the respective mounting platforms.

13. The apparatus of claim 12 and further including:
   a main planar platform aligned substantially perpendicular to the respective planes of the plurality of respective mounting platforms;

wherein said output signal coupling means includes at least one second cable connector means for making electrical contact with at least one second external cable for receiving multiple respective output signals; and wherein said at least one second cable connector means is mounted on said main planar platform.

14. The apparatus of claim 13 wherein said control means includes:

at least one third cable connector means for making electrical contact with at least one third external cable providing output selection signals and encoded device selection signals;

decoder means for decoding the encoded device selection signals to identify respective selected devices;

a plurality of output selection signal lines extend in a direction substantially perpendicular to the respective planes of the respective mounting platforms; and at least one planar output selection signal aligned substantially parallel to the plurality of mounting platforms;

wherein the at least one output signal selection provides multiple conductive paths between said at least one third cable connector means and multiple of said plurality of output selection signal lines.

15. The apparatus of claim 14 and further including:

a main planar platform aligned substantially perpendicular to the respective planes of the plurality of respective mounting platforms;

wherein said at least one third cable connector means is mounted on said main platform.

16. The apparatus of claim 1 and further including:

control means for controlling respective selections of respective output signals by the plurality of respective devices.

17. The apparatus of claim 1 wherein each respective mounting platform includes a respective printed circuit board.

18. The apparatus of claim 1 and further comprising;

conductive material disposed over a respective substantially entire planar surface of each of said plurality of platforms opposite the respective devices;

wherein for each respective platform said respective conductive material is in electrical contact with at least one of said plurality of respective isolation lines.

19. A switching apparatus for use with a plurality of respective integrated circuit devices, each device including a plurality of respective pin terminals, wherein each of said respective devices can receive a plurality of high frequency input signals and can select from among the received input signals to provide at least one high frequency output signal, said switching apparatus comprising:

a plurality of respective substantially planar mounting printed circuit boards on which said respective devices are to be respectively mounted, wherein said respective mounting printed circuit boards are stacked substantially parallel to each other;

a plurality of respective input lines for conducting the respective input signals, each of said respective input lines extending in a direction substantially perpendicular to the respective planes of said respective mounting printed circuit boards, and each of said respective unput liens being electrically coupled to said respective mounting printed circuit boards that are to mount said respective devices that are to receive respective input signals conducted by each of said respective input lines;

a plurality of respective flat isolation strips for electrically isolating adjacent ones of said input lines from each other, each of said respective flat isolation strips extending in a direction substantially perpendicular to the respective planes of said respective mounting printed circuit boards, such that adjacent ones of said input lines have at least one of said respective flat isolation strips interposed therebetween;

a main planar printed circuit board aligned substantially perpendicular to the respective planes of said plurality of respective mounting printed circuit boards;

input signals coupling means mounted on said main printed circuit boards of respectively providing said respective input lines; and output signal coupling means mounted on said main printed circuit board for respectively receiving respective input signals respectively provided by said respective devices to be mounted on said respective mounting printed circuit boards.

20. The apparatus of claim 19 and further including:

control means mounted on said main platform for controlling respective selections of respective output signals by the plurality of respective devices to be mounted on said respective planar mounting platforms.

* * * * *

UNITED STATES PATENT AND TRADEMARK OFFICE
CERTIFICATE OF CORRECTION

PATENT NO. : 5,072,333
DATED : December 10, 1991
INVENTOR(S) : Robert B. Fenwick and John W. McMains It is certified that error appears in the above-identified patent and that said Letters Patent is hereby corrected as shown below:

Column 1, line 20, delete "inter-" and insert --interference or cross-talk between them. One approach used to achieve electrical isolation is to maintain physical separation of conductors carrying potentially interfering high frequency signals. Unfortunately, such physical separation can lead to somewhat large unwieldy switching devices.

Thus, there has been a need for a physically compact switching apparatus for switching high frequency signals among a plurality of terminals while maintaining the signals in electrical isolation from each other. The present invention meets these needs.--

Column 1, line 50, delete "thereof." and insert --thereof,--

Column 1, line 60, delete "2 top" and insert --2 is a top--

Column 1, line 62, delete "3 elevation" and insert --3 is a side elevation--

Column 1, line 65, delete "a" and insert --along--

Column 2, line 7, delete "electrical of" and insert --electrical coupling of--

UNITED STATES PATENT AND TRADEMARK OFFICE
CERTIFICATE OF CORRECTION

PATENT NO. : 5,072,333

DATED : December 10, 1991

INVENTOR(S) : Robert B. Fenwick and John W. McMains

It is certified that error appears in the above-identified patent and that said Letters Patent is hereby corrected as shown below:

Column 2, line 8, delete "circuit of" and insert --circuit device of--

Column 2, line 17 delete "the apparatus" and insert --the switching apparatus--

Column 2, line 19 of the printed patent, delete "electrical the" and insert --electrical connections among the--

Column 3, line 30, delete "15"

Column 9, line 17, delete "lines" and insert --lines that--

Column 10, line 17, delete "unput liens" and insert --input lines--

Signed and Sealed this

Twenty-second Day of June, 1993

Attest:

MICHAEL K. KIRK

Attesting Officer

Acting Commissioner of Patents and Trademarks